US007755199B2

(12) United States Patent
Wu

(10) Patent No.: US 7,755,199 B2
(45) Date of Patent: Jul. 13, 2010

(54) FLEXIBLE LEAD SURFACE-MOUNT SEMICONDUCTOR PACKAGE

(76) Inventor: Jiahn-Chang Wu, 15 Lane 13, Alley 439, Her-Chiang Street, Chu-Tung, Hsinchu (TW)

( * ) Notice: Subject to any disclaimer, the term of this patent is extended or adjusted under 35 U.S.C. 154(b) by 1078 days.

(21) Appl. No.: 10/404,793

(22) Filed: Apr. 2, 2003

(65) Prior Publication Data

US 2003/0201542 A1    Oct. 30, 2003

Related U.S. Application Data

(63) Continuation of application No. 09/756,007, filed on Jan. 8, 2001, now abandoned.

(51) Int. Cl.
*H01L 23/48* (2006.01)
(52) U.S. Cl. .................. 257/773; 257/E23.039
(58) Field of Classification Search ................ 257/669, 257/676, 735, 782, 783, 666, 674, 730, 773–776, 257/E33.066, E23.039, E23.048, E23.059
See application file for complete search history.

(56) References Cited

U.S. PATENT DOCUMENTS

| 3,519,890 | A | * | 7/1970 | Ashby | ........................ 317/101 |
|---|---|---|---|---|---|
| 5,389,739 | A | * | 2/1995 | Mills | ........................... 174/540 |
| 5,521,431 | A | * | 5/1996 | Tahara | .......................... 257/676 |
| 5,661,338 | A | * | 8/1997 | Yoo et al. | ..................... 257/676 |
| 5,859,387 | A | * | 1/1999 | Gagnon | ...................... 174/52.2 |
| 5,903,048 | A | * | 5/1999 | Bandou et al. | .............. 257/676 |
| 6,303,985 | B1 | * | 10/2001 | Larson et al. | ................ 257/676 |
| 6,313,402 | B1 | * | 11/2001 | Schreiber et al. | ........... 174/52.4 |
| 6,329,705 | B1 | * | 12/2001 | Ahmad | ........................ 257/666 |
| 6,369,440 | B1 | * | 4/2002 | Kobayashi | ................... 257/672 |
| 6,504,238 | B2 | * | 1/2003 | Cheng et al. | ................. 257/676 |
| 6,548,896 | B2 | * | 4/2003 | Guida | .......................... 257/728 |
| 2002/0130397 | A1 | * | 9/2002 | Yew et al. | ..................... 257/666 |
| 2002/0190358 | A1 | * | 12/2002 | Arguelles et al. | ............ 257/669 |

FOREIGN PATENT DOCUMENTS

EP          0503769     * 12/1992
JP        405335474 A    *  6/1992

OTHER PUBLICATIONS www.m-w.com Merriam-Webster Online Dictionary.*

\* cited by examiner

*Primary Examiner*—Brook Kebede

(57) ABSTRACT

A diode chip is mounted on two bottom metal leads of a surface-mount package through two flexible links. The links are zigzag cantilevers attached to the metallic plates. The cantilevers serve as springs to support the device and to cushion any temperature stress or bending stress so as not to damage the connection between the device and the metallic leads.

20 Claims, 10 Drawing Sheets

FLEXIBLE LEAD SURFACE-MOUNT SEMICONDUCTOR PACKAGE

This is application is a continuation of application Ser. No. 09/756,007, filed on Jan. 8, 2001, now abandoned.

FIELD OF INVENTION

This invention relates to semiconductor device package, particularly to surface mount optoelectric diode package, such as that for a light emitting diode (LED), a laser diode (LD), a photo diode (PD), etc. The invention is also applicable to a light sensor diode, such as a image sensor. The invention may also be applicable to packages for other non-optoelectric semiconductor devices.

BRIEF DESCRIPTION OF THE RELATED ART

FIG. 1 shows a prior art optoelectric diode package. A semiconductor chip 10 is mounted on two metallic plates 11, 12 serving as extension leads for a surface-mount diode package. The chip 10 is sealed in glue 13 for protection. FIG. 2 shows the side view of the package. The outer portions of the metallic plates 11 and 12 are not covered with glue 13. The bottoms of the exposed portions L, R are contact surfaces for surface mounting to a motherboard. When the temperature changes, the motherboard may bend, causing the device chip 10 to break away from the metallic plates 11, 12. Then, the diode cannot function.

Another occasion for the device chip 10 to break away the metallic plates 11, 12 occurs when the diode package is mounted on a curvilinear motherboard such as a display panel. The curving of the surface can also cause bending stress on the device to damage the device. An example of such a situation occurs when a decorative light emitting ribbon is mounted at the corner of an automobile body.

Still another occasion occurs for the keys of a computer key board. Sometimes, the keys are lit with a light emitting diodes for easy recognition in the dark. Due to constant pounding the keys, the light emitting devices may dislodge from the leads.

SUMMARY OF THE INVENTION

An object of the present invention is to prevent an optoelectric device from breaking away from the leads of a surface mount package due to temperature stress. Another object of this invention is to prevent a semiconductor device from breaking away from the leads of surface-mount package due to bending stress.

These objects are achieved by mounting a semiconductor chip to its bottom metal leads for surface mounting through two flexible links. The links are zigzag cantilevers attached to the metallic plates. The cantilevers serve as springs to support the device and to cushion any temperature stress or bending stress so as not to damage the connection between the device and the metallic leads.

DETAILED DESCRIPTION OF THE INVENTION

Figure 1:
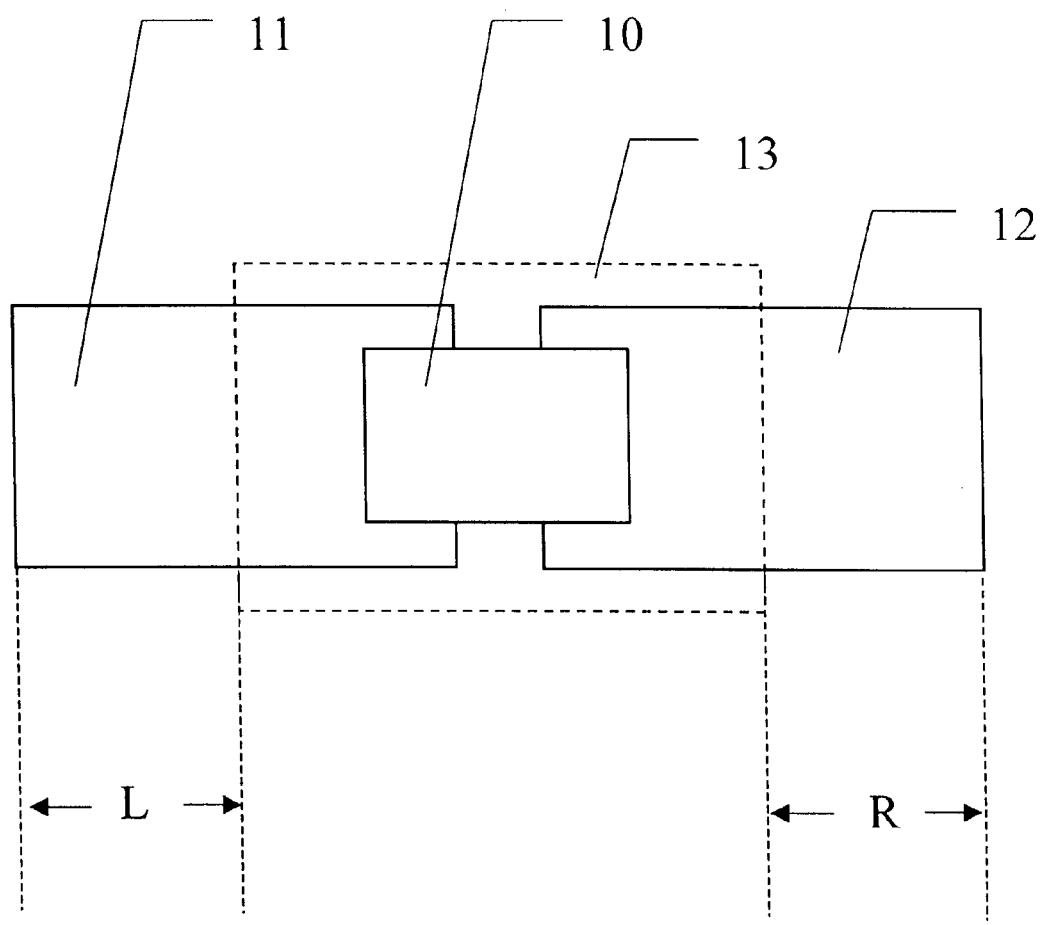
FIG. 1 shows the top view of a prior art package for surface mounting a diode chip to a motherboard.
Figure 2:
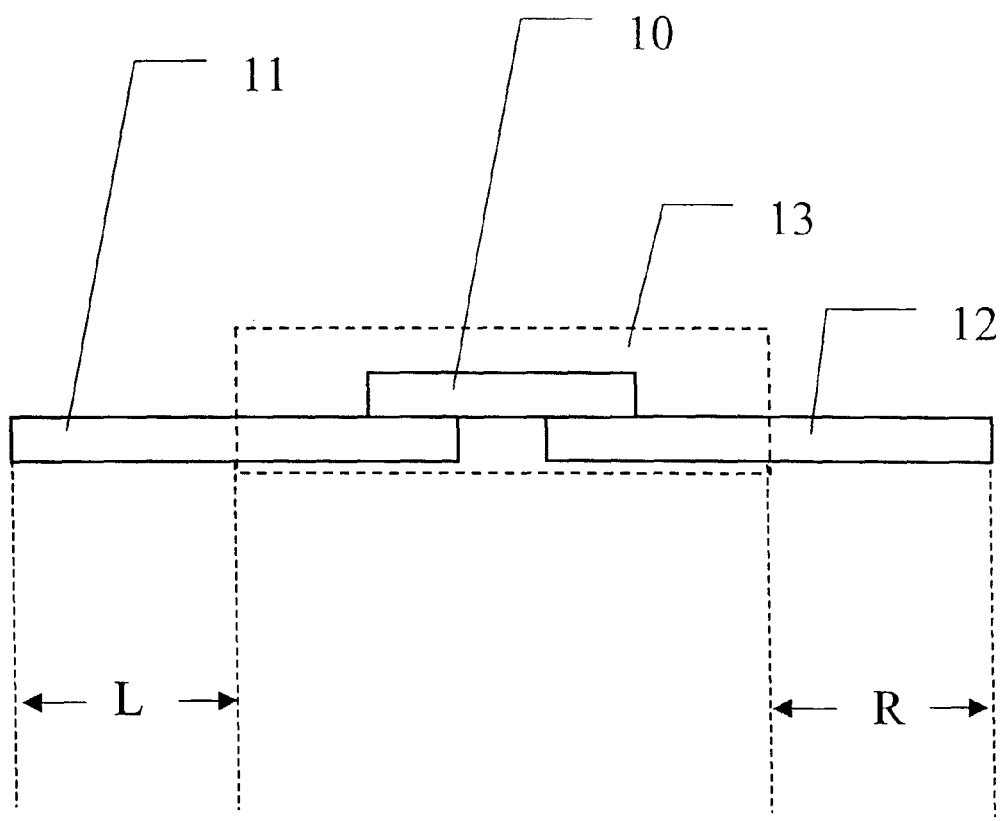
FIG. 2 shows the side view of FIG. 1.
Figure 3:
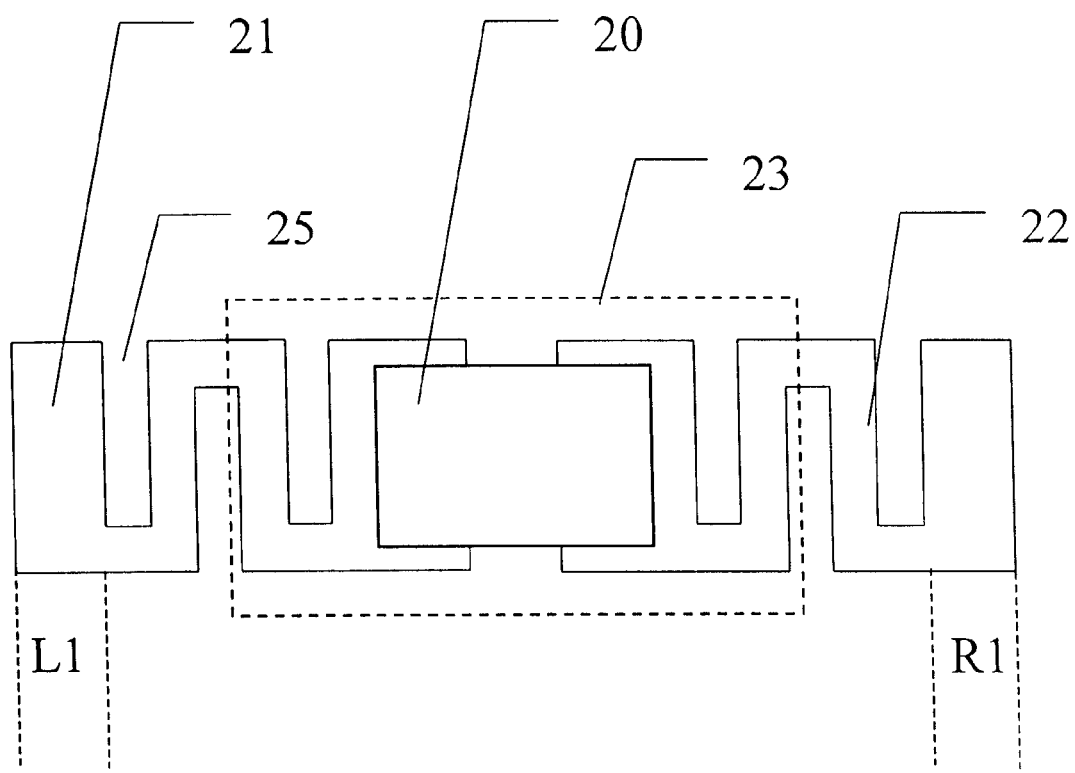
FIG. 3 shows the top view of diode package with two horizontal zigzag cantilevers based on the present invention.
Figure 4:
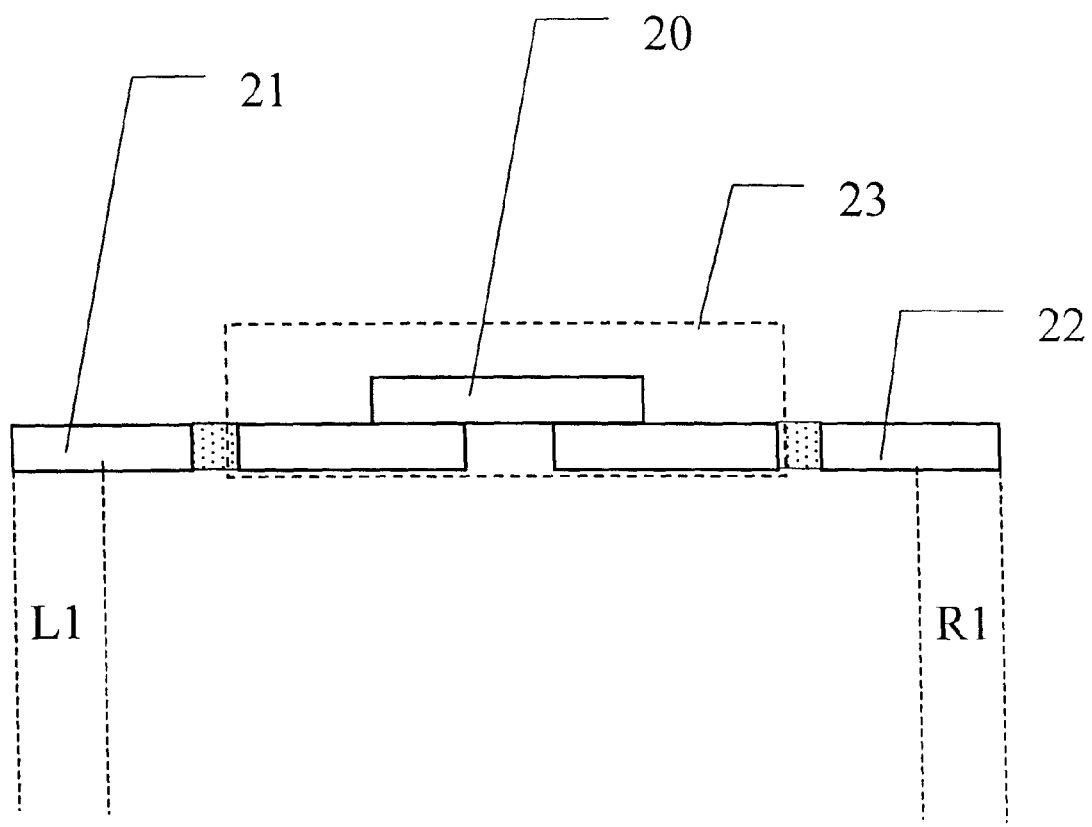
FIG. 4 shows the side view of FIG. 3.

FIG. 3 shows the top view of the first embodiment of diode package based on the present invention. A diode chip 20 is mounted on two metallic plates 21, 22. The metallic plates 21 and 22 have a rectangular cut 25 in the middle portion to form two horizontal zigzag cantilevers. The cantilevers serve as springs. When the package is subject to temperature variations, the spring action of the zigzag cantilevers can cushion the expansion and contraction stress. The chip 20 is sealed in glue 23 up to a portion of the zigzag cantilevers as shown in side view FIG. 4. The bottoms of the unsealed portions L1 and R1 of the metallic plates 21, 22 serve as contacts for surface mounting the package to a motherboard.

Figure 5:
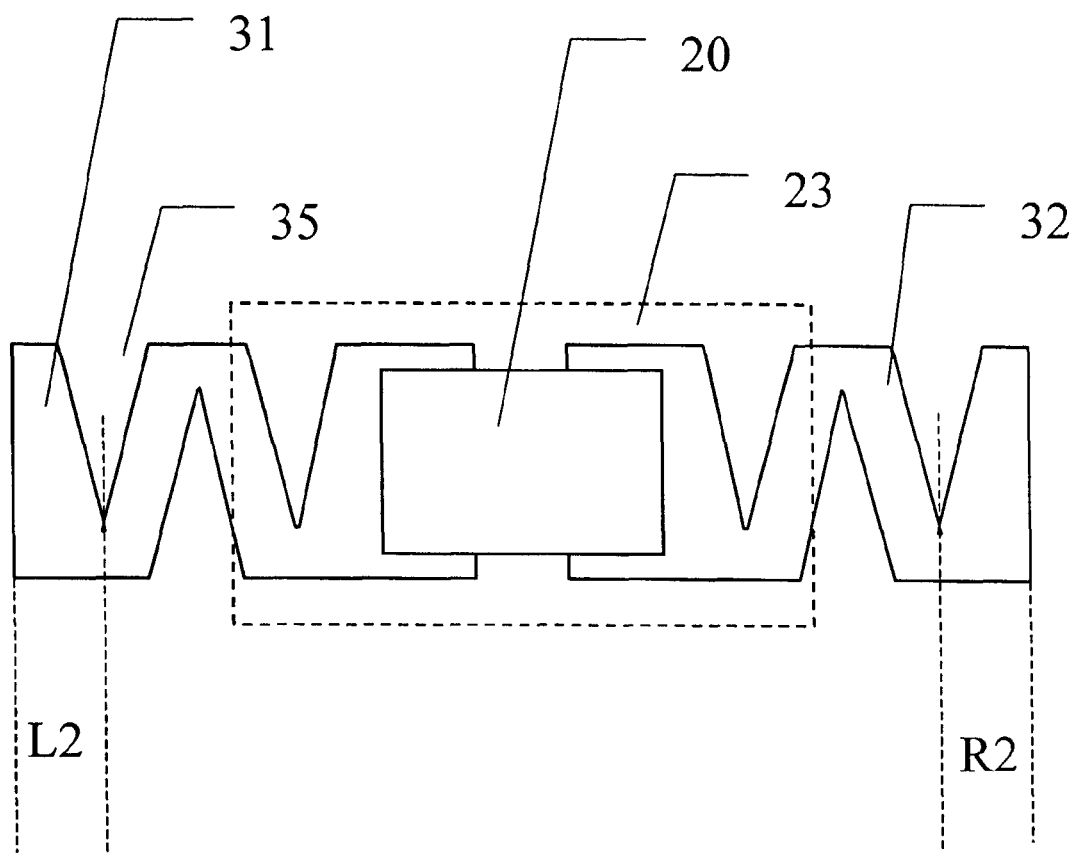
FIG. 5 shows the top view of a second embodiment of the package with two inverted V-shaped horizontal cantilevers.
Figure 6:
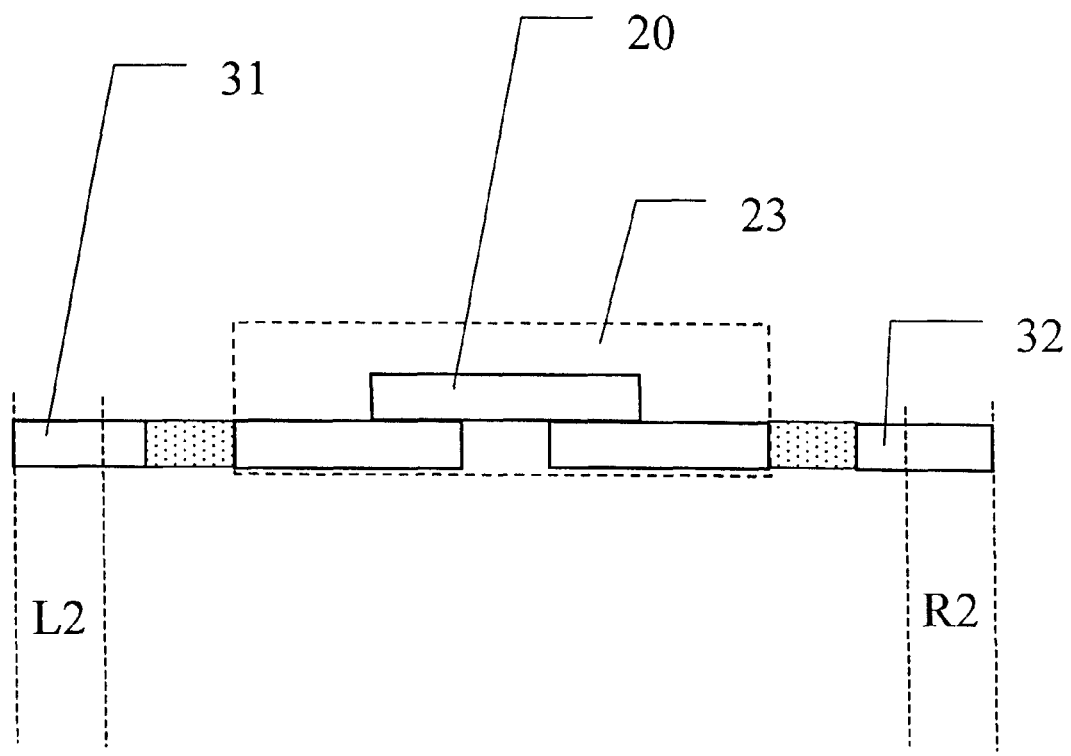
FIG. 6 shows the side view of FIG. 5.

FIG. 5 shows the top view of a second embodiment of this invention. The diode chip 20 is mounted on two metallic plates 31, 32 as in FIG. 3. However the cut 35 in the metallic plates 31, 32 is of inverted V-shape (instead of being rectangular) to form the zigzag cantilevers. Otherwise the function of zigzag cantilevers are the same as in FIG. 3. The chip 20 is sealed in glue 23 up to a portion of the zigzag cantilevers. FIG. 6 shows the side view of FIG. 5, corresponding to FIG. 4. The bottoms of the unsealed portions L2 and R2 of the metallic plates 31, 32 serve as contacts for surface mounting the package to a motherboard.

Figure 7:
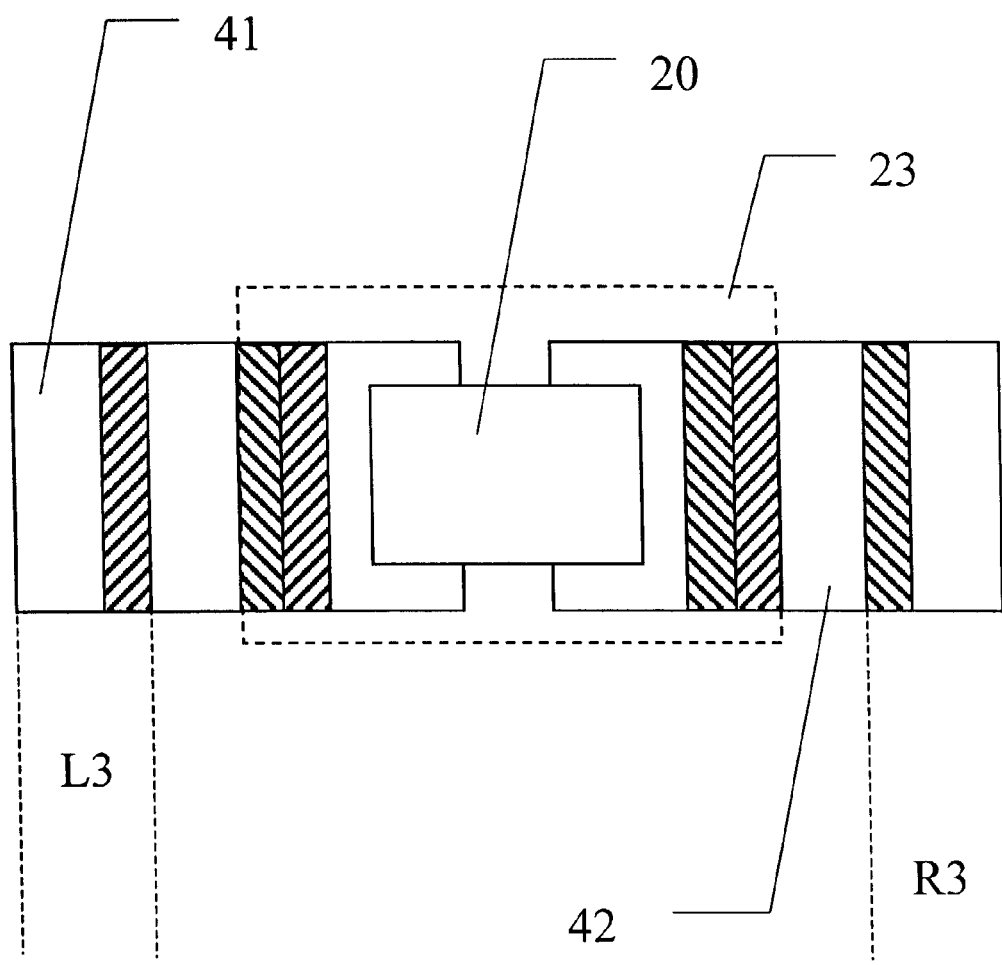
FIG. 7 shows the top view of a third embodiment of a package with two vertical cantilevers.
Figure 8:
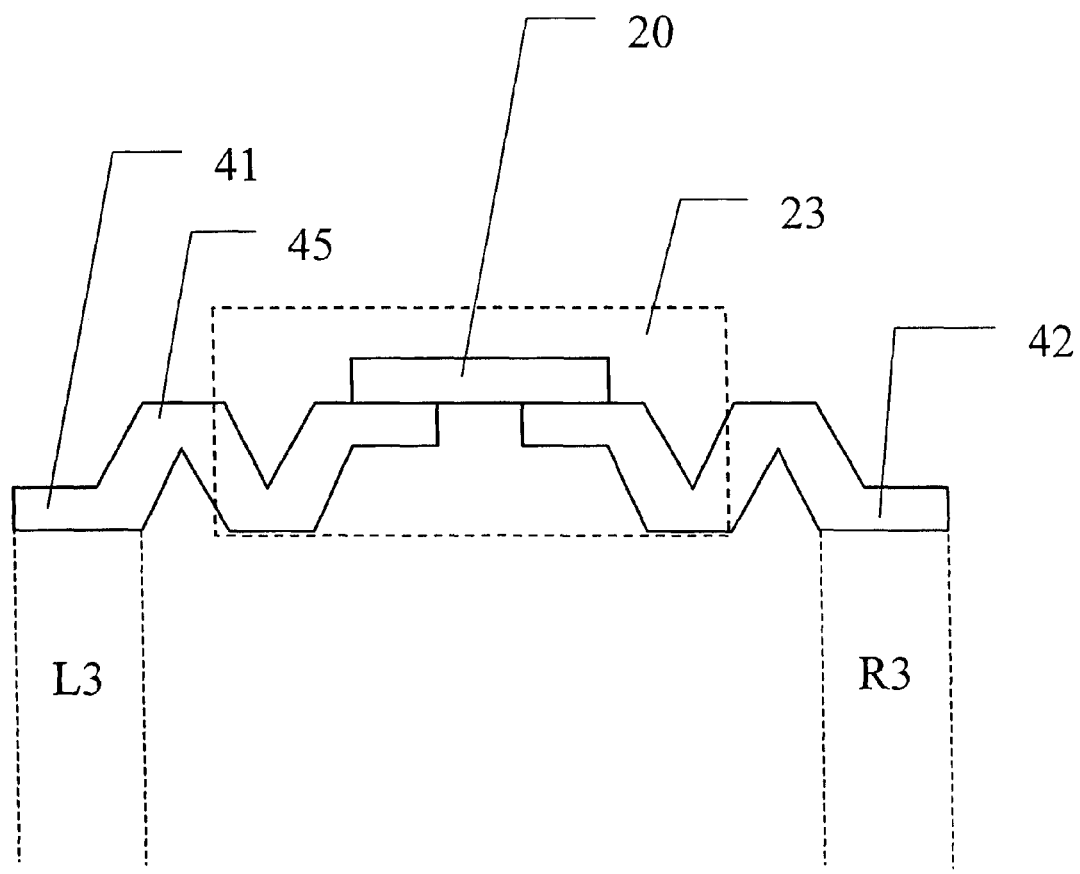
FIG. 8 shows the side view of FIG. 7.

FIG. 7 shows the top view of a third embodiment of the present invention. The diode chip 20 is mounted on two metallic plates 41, 42. The metallic plates are bent to form two vertical zigzag cantilevers 45. As in FIG. 3 and FIG. 5, the zigzag cantilevers serve as springs to cushion the stress due to temperature variations and bending. FIG. 8 shows the side view of FIG. 7. The chip 20 is sealed in glue 23 up to a portion of the zigzag cantilevers. The bottoms of the unsealed portions L3 and R3 of the metallic plates 41, 42 serve as contacts for surface mounting the package to a motherboard.

Figure 9:
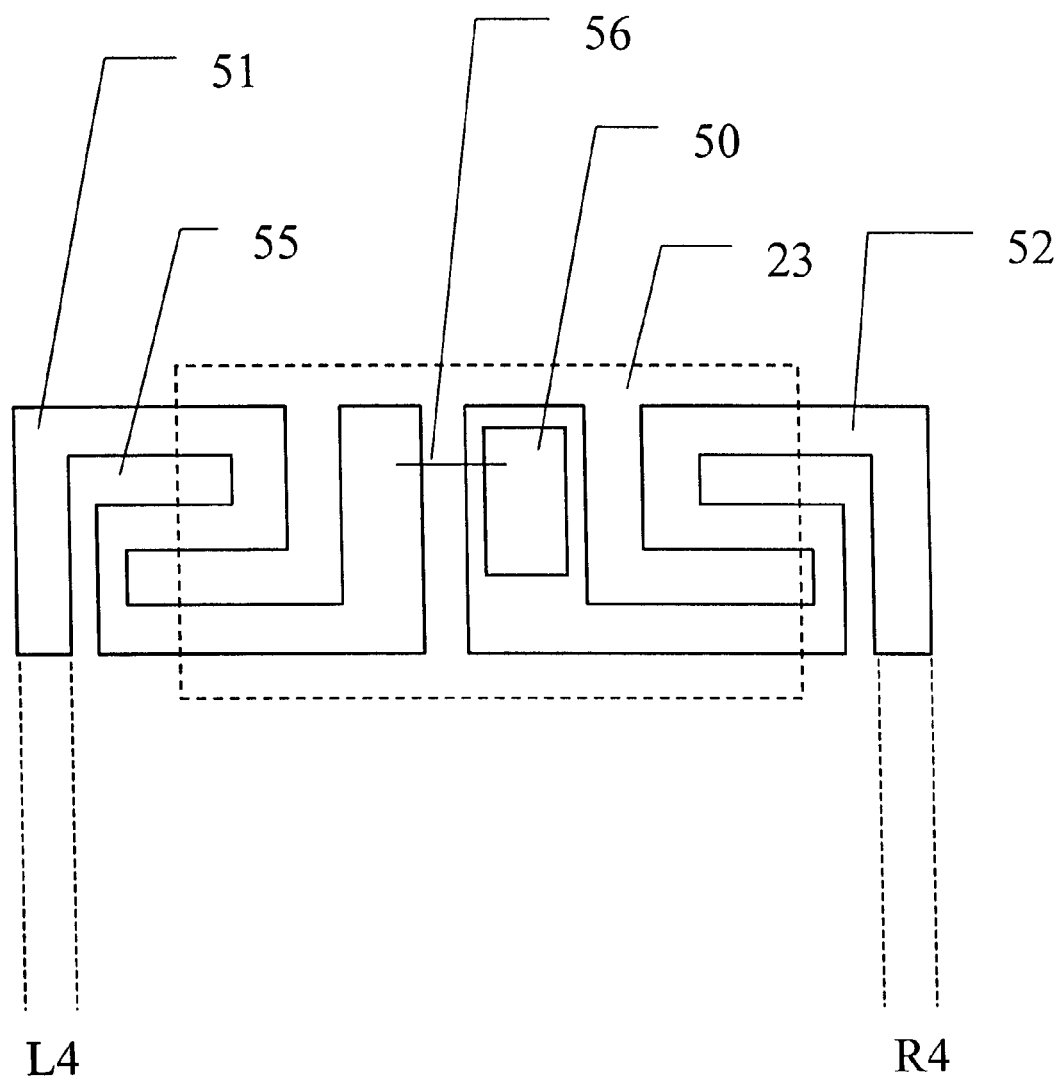
FIG. 9 shows the top view of a fourth embodiment of a package with two horizontal zigzag cantilevers for packaging a diode with a top electrode and a bottom electrode.
Figure 10:
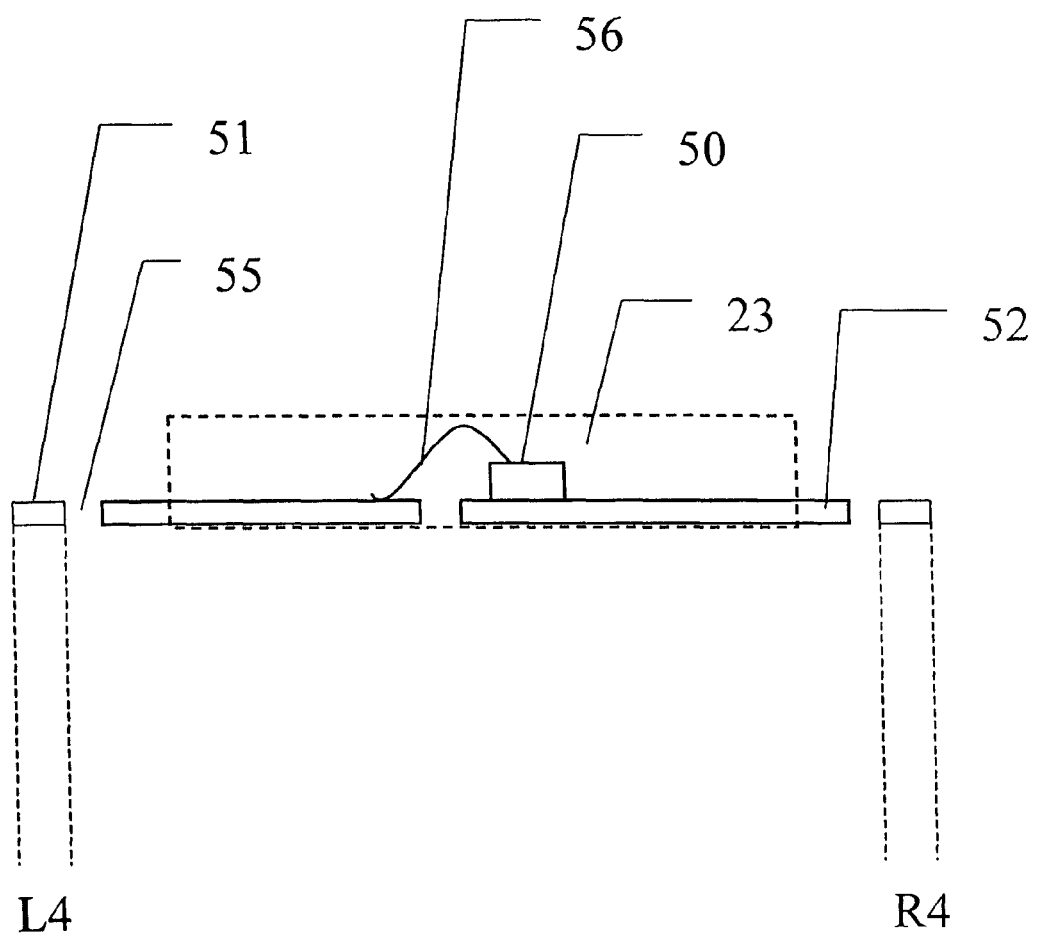
FIG. 10 shows the side view of FIG. 9.

FIG. 9 shows the top view of a fourth embodiment of the present invention. The diode chip 50 has a top electrode and a bottom electrode, unlike the chip 20 in previous embodiments with two bottom electrodes. The diode chip 50 is mounted on a metallic plate 52. The top electrode of diode chip 50 is wire-bonded by wire 56 to the second metallic plate 51, as shown in side view FIG. 10. As in previous first and second embodiments, metallic plates 51 and 52 have cuts 55 to form horizontal zigzag cantilevers. The zigzag cantilevers serve as springs to cushion the stress due to temperature variations and bending. The chip 50 is sealed in glue 23 up to a portion a portion of the zigzag cantilevers. The bottoms of the unsealed portions L4 and R4 of the metallic plates 51 and 52 respectively serve as contacts for surface mounting the package the package to a motherboard.

While the preferred embodiments of the invention have been described, it will be apparent to those skilled in the art that various modifications may be made in the embodiments without departing from the spirit of the present invention. Such modifications are all within the scope of this invention.

The invention claimed is:

1. A surface mount semiconductor device package, comprising:
   a semiconductor device; and
   a first metallic plate comprising opposite inner and outer ends, and a flat curve cantilever bridging the two ends to cushion stress between the two ends;
   protection glue covering at least the semiconductor device and the inner end of the metallic plate;
   wherein
   said semiconductor device is mounted on an upper surface of said inner end to be electrically coupled to said inner end;
   said outer end has a lower surface opposite to the upper surface and adapted to be mounted on a substrate; and
   wherein said cantilever comprises:
   an inner zigzag portion connected to the inner end and covered by the protection glue, and
   an outer zigzag portion connected to the outer end and positioned outside the protection glue.

2. A surface mount semiconductor device package as claimed in claim 1, wherein said flat curve cantilever is a continuous shaped metal having a shape selected from the group consisting of U shape, V shape, and L shape.

3. A surface mount semiconductor device package as claimed in claim 1, wherein said semiconductor device is a diode.

4. A surface mount semiconductor device package as described in claim 3, wherein said diode has two bottom electrodes.

5. The surface mount semiconductor device as described in claim 3, wherein said diode has a top electrode and a bottom electrode.

6. The surface mount semiconductor device as described in claim 5, further comprising a second metallic plate; said bottom electrode rests on the first metallic plate, and said top electrode is wire-bonded to the second metallic plate.

7. The surface mount semiconductor device as described in claim 1, wherein said inner end, cantilever, and outer end are coplanar.

8. The surface mount semiconductor device as described in claim 1, further comprising:
   a second metallic plate comprising opposite inner and outer ends, and a second flat curve cantilever bridging the two ends of the second metallic plate to cushion stress between the two ends of the second metallic plate;
   wherein
   said semiconductor device is further mounted on an upper surface of said inner end of the second metallic plate to be electrically coupled to said inner end of the second metallic plate and to span between the inner ends of the first and second metallic plates; and
   said outer end of the second metallic plate has a lower surface opposite to the upper surface and adapted to be mounted on the substrate.

9. A surface mount semiconductor device package as claimed in claim 8,
   wherein said second cantilever comprises:
   an inner zigzag portion connected to the inner end of the second metallic plate and covered by the protection glue, and
   an outer zigzag portion connected to the outer end of the second metallic plate and positioned outside the protection glue.

10. A surface mount semiconductor device package as claimed in claim 9, wherein said semiconductor has two bottom electrodes each being electrically connected to one of the metallic plates.

11. A surface mount semiconductor device package as claimed in claim 9, wherein
   the outer end of each of the metallic plates, the lower surface of which is adapted to be directly mounted on the substrate, is spaced from the protection glue by the respective outer zigzag portion which is not adapted to be directly mounted on the substrate, and
   the protection glue as well as the semiconductor device and the inner ends embedded therein are adapted to be supported over the substrate, without direct contact with the substrate, by spring action of the outer zigzag portions of the respective metallic plates.

12. A surface mount semiconductor device package as claimed in claim 1, wherein
   the outer end, the lower surface of which is adapted to be directly mounted on the substrate, is spaced from the protection glue by the outer zigzag portion which is not adapted to be directly mounted on the substrate, and
   the protection glue as well as the semiconductor device and the inner end embedded therein are adapted to be supported over the substrate, without direct contact with the substrate, by spring action of at least the outer zigzag portion.

13. A surface mount semiconductor device package as claimed in claim 1, further comprising
   a second metallic plate comprising opposite inner and outer ends, and a second flat curve cantilever bridging the two ends of the second metallic plate to cushion stress between the two ends of the second metallic plate;
   wherein
   said semiconductor device has a top electrode wire-bonded to the inner end of the second metallic plate and a bottom electrode mounted on and electrically connected to the inner end of the first metallic plate;
   the outer end of the second metallic plate has a lower surface opposite to the upper surface and adapted to be mounted on the substrate; and
   the semiconductor device is entirely mounted on the inner end of the first metallic plate.

14. A surface mount semiconductor device package as claimed in claim 13, wherein said second each said cantilever comprises:
   an inner zigzag portion connected to the inner end of the second metallic plate and covered by the protection glue, and
   an outer zigzag portion connected to the outer end of the second metallic plate and positioned outside the protection glue; and
   the outer end of each of the metallic plates, the lower surface of which is adapted to be directly mounted on the substrate, is spaced from the protection glue by the respective outer zigzag portion which is not adapted to be directly mounted on the substrate, and
   the protection glue as well as the semiconductor device and the inner ends embedded therein are adapted to be supported over the substrate, without direct contact with the substrate, by spring action of the outer zigzag portions of the respective metallic plates.

15. A surface mount semiconductor device package mounted on top of a substrate, said package comprising:
- a semiconductor device;
- a first metallic plate comprising opposite inner and outer ends, and a cantilever bridging the two ends to cushion stress between the two ends; and
- protection glue covering at least the semiconductor device and the inner end of the metallic plate;
- wherein said cantilever comprises:
- an inner zigzag portion connected to the inner end and covered by the protection glue, and
- an outer zigzag portion connected to the outer end and positioned outside the protection glue;
- wherein
- said semiconductor device is mounted on an upper surface of said inner end to be electrically coupled to said inner end;
- said outer end has a lower surface opposite to the upper surface and mounted directly on the substrate;
- the outer end, the lower surface of which is directly mounted on the substrate, is spaced from the protection glue by the outer zigzag portion which is not directly mounted on the substrate, and
- the protection glue as well as the semiconductor device and the inner end embedded therein are supported over the substrate, without direct contact with the substrate, by spring action of at least the outer zigzag portion.

16. The surface mount semiconductor device package mounted on top of the substrate as claimed in claim 15, wherein the package further comprises:
- a second metallic plate comprising opposite inner and outer ends, and a second cantilever bridging the two ends of the second metallic plate to cushion stress between the two ends of the second metallic plate;
- wherein
- said semiconductor device is further mounted on an upper surface of said inner end of the second metallic plate to be electrically coupled to said inner end of the second metallic plate and to span between the inner ends of the first and second metallic plates; and
- said outer end of the second metallic has a lower surface opposite to the upper surface and mounted directly on the substrate.

17. The surface mount semiconductor device package mounted on top of the substrate as claimed in claim 16, wherein
- said second cantilever comprises:
- an inner zigzag portion connected to the inner end of the second metallic plate and covered by the protection glue, and
- an outer zigzag portion connected to the outer end of the second metallic plate and positioned outside the protection glue;
- the outer end of each of the metallic plates, the lower surface of which is directly mounted on the substrate, is spaced from the protection glue by the respective outer zigzag portion which is not directly mounted on the substrate, and
- the protection glue as well as the semiconductor device and the inner ends embedded therein are supported over the substrate, without direct contact with the substrate, by spring action of the outer zigzag portions of the respective metallic plates.

18. The surface mount semiconductor device package mounted on top of the substrate as claimed in claim 15, further comprising
- a second metallic plate comprising opposite inner and outer ends, and a second cantilever bridging the two ends of the second metallic plate to cushion stress between the two ends of the second metallic plate;
- wherein
- said semiconductor device has a top electrode wire-bonded to the inner end of the second metallic plate and a bottom electrode mounted on and electrically connected to the inner end of the first metallic plate;
- the outer end of the second metallic plate has a lower surface opposite to the upper surface and mounted directly on the substrate; and
- the semiconductor device is entirely mounted on the inner end of the first metallic plate.

19. The surface mount semiconductor device package mounted on top of the substrate as claimed in claim 18, wherein
- said second cantilever comprises:
- an inner zigzag portion connected to the inner end of the second metallic plate and covered by the protection glue, and
- an outer zigzag portion connected to the outer end of the second metallic plate and positioned outside the protection glue; and
- the outer end of each of the metallic plates, the lower surface of which is directly mounted on the substrate, is spaced from the protection glue by the respective outer zigzag portion which is not directly mounted on the substrate, and
- the protection glue as well as the semiconductor device and the inner ends embedded therein are supported over the substrate, without direct contact with the substrate, by spring action of the outer zigzag portions of the respective metallic plates.

20. The surface mount semiconductor device package mounted on top of the substrate as claimed in claim 18, wherein
- said second cantilever comprises:
- an inner zigzag portion connected to the inner end of the second metallic plate and covered by the protection glue, and
- an outer zigzag portion connected to the outer end of the second metallic plate and positioned outside the protection glue; and
- the outer end of each of the metallic plates, the lower surface of which is directly mounted on the substrate, is spaced from the protection glue by the respective outer zigzag portion which is not directly mounted on the substrate, and
- the protection glue as well as the semiconductor device and the inner ends embedded therein are freely supported over the substrate, without direct contact with the substrate, by spring action of the outer zigzag portions of the respective metallic plates.

* * * * *